United States Patent
Hille (10) Patent No.: US 6,504,697 B1
(45) Date of Patent: Jan. 7, 2003

(54) ARRANGEMENT AND METHOD FOR MEASURING A TEMPERATURE

(75) Inventor: Peter Hille, Darmstadt (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/367,104

(22) PCT Filed: Jan. 29, 1998

(86) PCT No.: PCT/EP98/00469
§ 371 (c)(1),
(2), (4) Date: Dec. 8, 1999

(87) PCT Pub. No.: WO98/35440
PCT Pub. Date: Aug. 13, 1998

(30) Foreign Application Priority Data

Feb. 10, 1997 (DE) .......................... 197 04 861

(51) Int. Cl.$^7$ ................................. H02H 5/04
(52) U.S. Cl. ...................................... 361/103
(58) Field of Search ................. 361/103, 54, 100, 361/56, 101; 257/355, 328, 28, 43

(56) References Cited

U.S. PATENT DOCUMENTS

| | | | | |
|---|---|---|---|---|
| 4,875,131 A | * | 10/1989 | Leipold et al. | 361/103 |
| 4,896,196 A | * | 1/1990 | Blanchard et al. | 357/23.4 |
| 4,903,106 A | * | 2/1990 | Fukunaga et al. | 357/43 |
| 5,100,829 A | * | 3/1992 | Fay et al. | 437/60 |
| 5,237,481 A | * | 8/1993 | Soo et al. | 361/103 |
| 5,304,837 A | * | 4/1994 | Hierold | 257/470 |
| 5,349,336 A | * | 9/1994 | Nishiura | 340/653 |
| 5,451,806 A | | 9/1995 | Davies | |
| 5,550,701 A | | 8/1996 | Nadd et al. | |

FOREIGN PATENT DOCUMENTS

| | | |
|---|---|---|
| DE | 3821460 C2 | 4/1989 |
| EP | 0749208 A2 | 12/1996 |
| JP | 1-196858 A | 8/1989 |

OTHER PUBLICATIONS

Patents Abstracts of Japan, E–842, 1989, vol. 13/No. 493 JP 1–196858 A.
Von Erich Gelder und Walter Hirschmann, Schaltungen mit Halbleiterbauelementen, Band 4: Beispiele mit Transistoren und intergrierten Schaltungen; 1970; p. 62.

* cited by examiner

Primary Examiner—Brian Sircus
Assistant Examiner—J. F. Duverne
(74) Attorney, Agent, or Firm—Venable; Norman N. Kunitz (57) ABSTRACT

An arrangement for overload protection of a switch to which a load circuit and a control circuit are connected, wherein: the control circuit includes at least one logic circuit, a gate drive connected between an output of the logic circuit and a control input of the switch, a comparator, and a temperature sensor. The comparator compares a voltage drop across the switch to a predetermined threshold value, and the temperature sensor is a discrete component relative to at least the switch and has an associated threshold-value recognition. The logic circuit is responsive to the output of the comparator and the temperature sensor to cause the gate driver to switch off the switch when at least one limit value for the voltage drop across the switch, or a limit value for the permissible switch temperature, is exceeded. Moreover, the temperature sensor has its temperature-measurement point on an external electrical connection of the switch, with this electrical connection simultaneously serving for the thermal coupling of the temperature sensor and the switch.

15 Claims, 6 Drawing Sheets

ARRANGEMENT AND METHOD FOR MEASURING A TEMPERATURE

BACKGROUND OF THE INVENTION

The invention relates to an arrangement and a method for measuring a temperature, in particular for high-power semiconductors.

The high-power switching of electrical consumers with elements such as mechanical relays is known. However, these are only conditionally reliable and are sensitive, in particular to mechanical stresses. Integrated semiconductor switches are increasingly used for the high-power switching of electrical consumers since these semiconductor switches have a higher reliability and a lower sensitivity relative to mechanical vibrations. However, these components have the disadvantage that they are more sensitive than mechanical relays to electrical and/or thermal overloads because of their p/n barrier layers.

A continuous operation at high temperatures, near the maximum permissible barrier layer temperature, accelerates the degradation of semiconductor component. In addition, the sensitivity to other overload conditions is increased. Excessive current endangers the semiconductor component in two ways. On the one hand, the metal coating and/or the bond-wire system can be damaged if the permissible current densities are exceeded. On the other hand, there is danger that the excessive current will lead to an extremely sharp increase in the loss power, thus causing the component to fail if the maximum barrier layer temperature is exceeded.

Different types of overload protection devices for semiconductors are known. Essentially, the protection focuses on monitoring the barrier-layer temperature (on-chip temperature measuring), as disclosed in the German Patent 41 22 653 C2 or the monitoring of the load current for the power semiconductor, as known from the German Patent 43 20 021 A1.

With monolithically integrated power semiconductor switches, so-called smart power circuits, a sensor is frequently used to monitor the temperature. This sensor is thermally connected to the semiconductor barrier layer that switches the main current. The design disclosed in the German Patent Specification 41 22 653 C2 provides that some of the switching cells in the switching arrangement are designed to be particularly weak and that the barrier layer temperature of the switching arrangement is measured directly at those locations. Thus, the highest component temperature is measured at these artificially created weak locations. Once a maximum local component temperature is exceeded, the switch is turned off without this causing a thermal overload for the other cells in the switch. This arrangement, however, poses high requirements with respect to technology, e.g. by requiring additional contact connections for the temperature sensor. The alternative of determining the component temperature at a location far from the barrier layer, e.g. on the housing, leads to intolerable time delays during a sudden temperature increase as a result of the great distance to possibly thermally stressed barrier layers. In the final analysis, it leads to the destruction of the barrier layer.

SUMMARY OF THE INVENTION

It is the object of the invention to use a simple method for measuring the outside temperature of a component, particularly of a non-contacting switch.

This object is solved according to the invention by the features in the independent claims. Modified and advantageous embodiments follow from the additional claims and the description. The invention makes it possible to determine and monitor the component temperature with less expenditure.

The invention starts with the premise of providing overload protection for the active zone J or zones J to be controlled of a switch having a load circuit and a control circuit by using a combination of residual voltage monitoring and temperature monitoring. The overload protection is further improved with the temperature-measuring arrangement according to the invention, as well as an advantageous compensation method.

The control circuit is dimensioned such that the thermal resistances are taken into consideration for limiting the maximum load current flowing in the switch. These thermal resistances hinder the heat discharge between the active zone and/or the active zones J inside the switching body, which are particularly affected by the loss power and present an obstacle for a temperature sensor at the outside of the switching element. It is thus achieved that the maximum permissible temperature at the active zone J to be controlled of the switch cannot be exceeded.

The invention is preferably used for switches encumbered with loss power and is particularly preferred for MOSFET switches.

The fact that switches of this type can be utilized over a broader power range than is normally possible, owing to their dimensional layout, is an advantage. In contrast to the prior art, the dimensional layout no longer is a "worst case" estimation. The maximum load current in the switch is reliably limited. It is therefore possible to operate the switch continuously near the maximum temperature, without risking the destruction of an active zone J to be controlled in the switching body through short, undetectable or only delayed detectable temperature peaks. There is no need for a quick temperature measurement in order to monitor the temperature, in particular temperature peaks, at the active zone J, so that cheap, simple and even slower temperature measuring methods can be used.

Another advantage is that the dimensional layout of the switch/control circuit makes it possible to measure the switch temperature not near the barrier layer, but more usefully near the housing, which simplifies the measuring arrangement. According to the invention, a bipolar transistor or a diode is used in that case for the temperature measuring.

According to the invention, one of the electrical contacts of the temperature sensor must be arranged electrically as well as thermally at least indirectly at the switch and/or the switch housing. Particularly suited are transistors or diodes. It makes sense if these have essentially planar contacts, which permit a particularly good thermal connection to the switch. An especially preferred arrangement is the direct hook-up of the collector terminal of a preferably used bipolar transistor to the drain of a preferably used MOSFET switch. Together with the dimensional layout of the switch/ control circuit according to the invention, this simple and cheap temperature-measuring arrangement represents a further simplification and improvement of the overload monitoring.

The temperature measuring point can be, for example, a conductive track, a barrier layer, a housing or the like for one or several switches to be monitored. This advantageous type of temperature measuring is suitable for different components and is not limited to the use of semiconductor switches.

A particularly advantageous modification of the invention consists in compensating the temperature dependence of the switching threshold of the switch/control circuit. The temperature in that case can be measured near the barrier layer or far from the barrier layer. The method according to the invention therefore can be used advantageously not only for the preferred arrangement, but also for switches, particularly semiconductor switches, where at least indirectly, the barrier layer temperature itself is monitored.

The features, insofar as they are essential to the invention, are discussed in further detail in the following with the aid of Figures.

DESCRIPTION OF THE PREFFERED EMBODIMENTS

Figure 1:
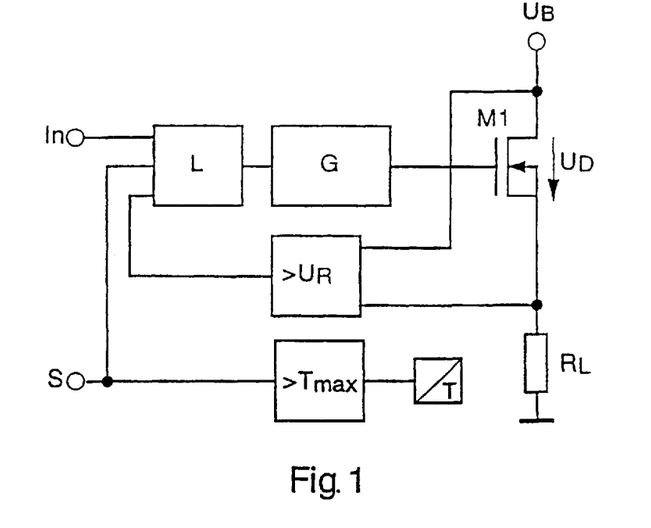
FIG. 1 shows a overload protection arrangement with residual voltage monitoring and temperature monitoring.

A model of an overload protection arrangement is shown using the exemplary embodiment of an arrangement with MOSFET switch in FIG. 1. The invention is not limited to this simple arrangement. Rather, it is suitable for switches showing a residual voltage during the operation, which therefore exhibit a loss power. The switch preferably has a load circuit and a control circuit with electrical inputs and/or outputs on the load-circuit side and on the control-circuit side. Once a threshold voltage $U_R$ is exceeded in the load circuit and/or a limit temperature $T_{max}$ of the switch M1 is exceeded, the switch M1 is shut down at least indirectly, preferably via a logic circuit L and a gate driver G. The switch M1 preferably is a power MOSFET. The temperature T is detected with a sensor T. A comparator in the control circuit compares the residual voltage at the switch, particularly the actual voltage drop $U_{DS}$ at the MOSFET M1 on the load-circuit side, to a comparator threshold $U_R$.

Figure 2:
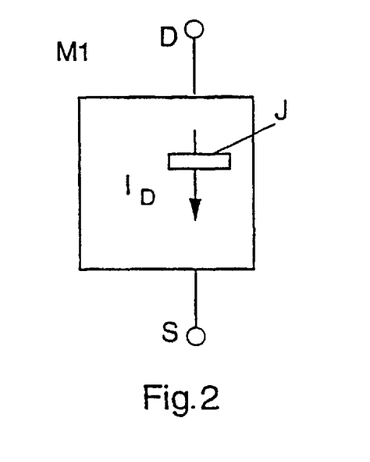
FIG. 2 shows a switch with active zone and load current.

The diagram in FIG. 2 shows a switch M1 with an active zone J arranged in the switching body. The temperature of the active zone J is $T_J$. A load current $I_D$ flows through the active zone J. Possibly existing connections on the load-circuit side or the control-circuit side are not shown.

Below the saturation voltage of switch M1, the voltage drop $U_{DS}$ at the switch M1 is proportional to the drain current $I_D$ and the on-resistance $R_{DS,on}$, which is a typical component variable for the switch M1. The on-resistance $R_{DS,on}$ generally is not accessible for a measurement, but only the residual voltage $U_{DS}$ at the switch. The following therefore applies:

$$U_{DS}=I_D \cdot R_{DS,on}.$$

The dependence of the residual voltage $U_{DS}$ can be used to measure the load current, particularly the drain current $I_D$ at the on-resistance $R_{DS,on}$, and can thus be used for a relatively exact overcurrent interruption. Limiting the load current $I_D$ is advantageous. The interruption occurs at comparably low voltages already, so that the loss power $P_v=U_{DS} \cdot I_D$ at the switch M1 remains low. Also, the protection of a possibly connected consumer on the load side can be ensured in this way.

The dimensional layout according to the invention of the control circuit for switch M1 can be used to change the comparator threshold $U_R$ for the residual voltage monitoring, such that the switch M1 can tolerate considerably higher flows than standard, commercially available circuits for switches, which are operated with a conventional residual voltage monitoring.

Figure 3:
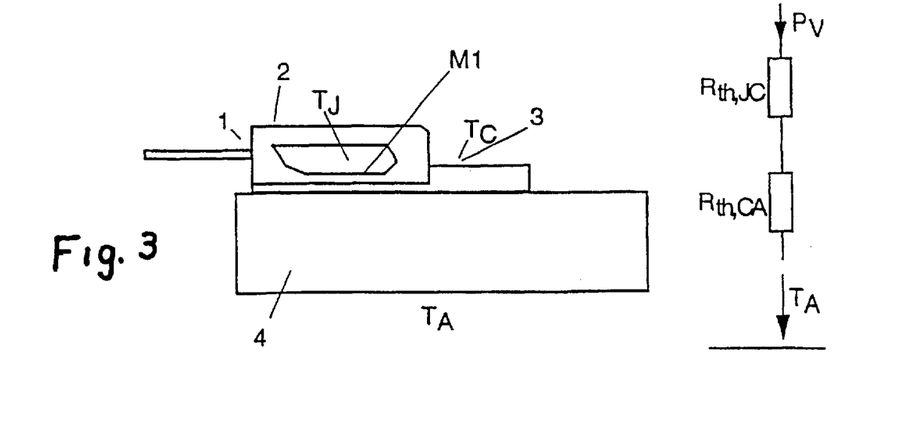
FIG. 3 is a cross section through an arrangement with local temperatures and thermal resistances.

The maximum load current, preferably the drain current $I_D$ for a MOSFET switch M1, is preferably determined with the aid of the maximum loss power $P_{V,max}$ that can be discharged. The diagram in FIG. 3 contains the variables, which generally must be taken into account. A switch arrangement 1, comprising a switch M1 inside housing 2 and a cooling vane 3, is arranged on a heat sink 4. The heat sink 4 can be a metal heat sink or a mounting board or the like. $T_J$ is the temperature of the controllable, active zone J of switch M1 that is to be protected, particularly of the barrier layer for the MOSFET switch, while $T_C$ is the temperature at the rear of the housing 2. The environmental temperature of the heat sink is $T_A$. $R_{th,JC}$ denotes the thermal resistance between the active zone J of switch M1, particularly the barrier layer of the MOSFET, and the rear side of housing 2, which is formed by the cooling vane 3. The cooling vane 3 can be a component connection of switch M1, particularly the drain connection for the MOSFET switch. $R_{th,CA}$ denotes the thermal resistance that determines the heat transport from the back of housing 2 and/or the cooling vane 3 through a possible heat sink 4 and to the environment of the switching arrangement. The total thermal resistance $R_{th,JA}$ from the active zone J of switch M1 to the environment is the quotient of the sum of the two individual thermal resistances. The following applies for the maximum permissible loss power $P_{V,max}$:

$$P_{V,max}=(T_{J,max}-T_{A,max})/R_{th/JA,max}=I^2_{D,max} \cdot R_{DS,on,max}$$

This equation is a 'worst-case' estimation. It stands for the worst case that can occur with the maximum permissible temperature of the active zone J, $T_{J,max}$, the maximum environmental temperature $T_{A,max}$, which can be expected under the most unfavorable environmental and/or operating conditions of switch M1, as well as the maximum thermal resistance $R_{th,JA,max}$ that can be safely achieved between active zone J and the environment of the complete switching arrangement.

The value of the on-resistance $R_{DS,on}$ of switch M1 is subjected to dispersions and, in particular, depends on the temperature of switch M1. In order to limit the loss power $P_v$, one must start with the static case where the switch M1 has already heated up to the maximum temperature. Based on prior art, the maximum on-resistance $R_{DS,on,max}$ is used in this case, wherein the following result is obtained with the 'worst-case' estimation for dimensioning the control circuit for the residual voltage $U_{DS,max}$, at which the switch M1 is finally switched off by the control circuit:

$$U_{DS,max} = \sqrt{((T_{J,max} - T_{A,max}) \cdot R_{DS,on,max} / R_{th,JA,max})}$$

The interrupting current depends on the temperature and reads as follows:

$$I_{D,max} = U_{DS,max} / R_{DS,on}(T_J)$$

For known arrangements, the hard to obtain information on the maximum achievable operating temperatures for the switch M1 operation and the problem of having to ensure a specific thermal resistance either lead to an over-dimensioning of the cooling for switch M1, which results in an increased space requirement for the complete arrangement, and/or to an under-utilization of the switch M1. Furthermore, the interrupting current $I_{D,max}$ can vary over the total temperature range by a factor of 2 to 3. To be sure, an interruption prior to reaching the maximum permissible loss power $P_{v,max}$ is ensured through the heating up of the switch, but its use as electronic circuit breaker is opposed by the great variation in the current.

Figure 4:
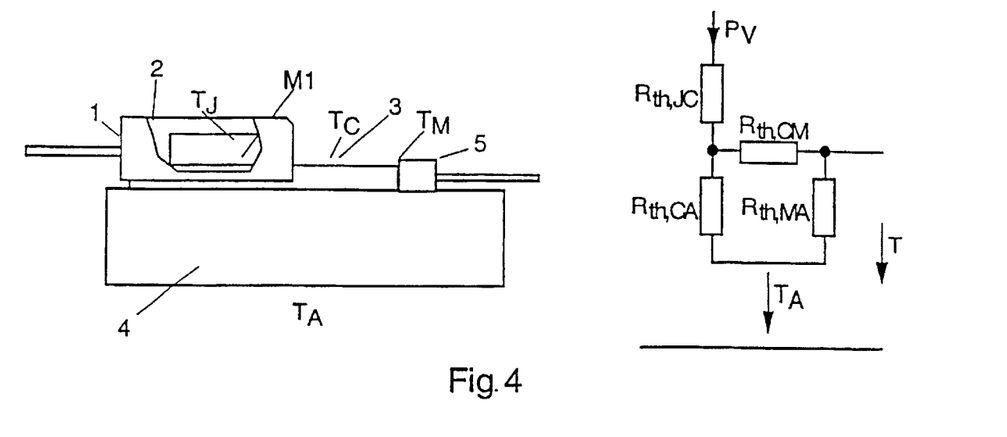
FIG. 4 Cross section through an arrangement according to the invention with temperature sensor and associated thermal resistances.

In FIG. 4, the inventive arrangement in FIG. 3 is shown with a temperature sensor 5 for measuring the temperature $T_M$ at a temperature measuring point of the switching arrangement 1. The temperature measuring point preferably is selected to be near the housing. An electrically conductive surface of the switch, preferably a conducting track or a drain connection, can also be selected as temperature measuring point. It makes sense to have a temperature measuring point with sufficiently good thermal coupling to the active zone J of the switch, particularly electrical feed lines to the switch body.

Four thermal resistances can be distinguished in a simplified design. The temperature $T_M$ at the temperature measuring point differs from the housing temperature $T_C$ because of the division of the heat flow through $R_{th,CM}$, that is the thermal resistance between housing 2 and temperature measuring point, and $R_{th,MA}$, the thermal resistance between measuring point and environment. Since the thermal resistance $R_{th,CM}$ between housing and temperature measuring point is low, particularly if the temperature measuring point is arranged on an electrically conductive surface of the switch, the measuring temperature $T_M$ differs only slightly from the housing temperature $T_C$.

For further consideration, an equivalent thermal resistance $R_{th,JM}$ is introduced, which correlates the temperature difference between active zone J of the switch, particularly the barrier layer, and the temperature measuring point to the total heat flow and replaces taking into account the hard to access individual thermal resistances $R_{th,CM}$ and $R_{th,MA}$. The following applies:

$$R_{th,JM} = (T_J - T_M) / P_v$$

To be sure, $R_{th,JM}$ depends on the heat discharge to the environment, but the dependence is lower than for the actually occurring thermal resistances in and on the switch component. The higher the heat discharge, the higher the equivalent thermal resistance. More exact statements can be obtained with simulated calculations, computations or measurements. In particular, the equivalent thermal resistance $R_{th,JM}$, however, is not dependent on the environmental temperature $T_A$ of the switch.

If the maximum permissible temperature $T_{M,max}$ at the temperature measuring point is introduced as the maximum permissible environmental temperature and if the maximum equivalent thermal resistance $R_{th,JM,max}$ is used, then a new rule for dimensioning the control circuit of the switch is obtained as follows:

$$U_{DS,max} = \sqrt{((T_{J,max} - T_{M,max}) \cdot R_{DS,on,max} / R_{th,JM,max})}$$

The maximum environmental temperature $T_{A,max}$, which is hard to determine ahead of time for the dimensioning, is replaced with the easily measured temperature $T_{M,max}$ and the hard to access thermal resistance $R_{th,JA,max}$ is replaced with the equivalent thermal resistance $R_{th,JM,max}$ that can be estimated. The switch is turned off as soon as a voltage $U_{DS}$ is detected in the control circuit, which is higher than a specified threshold voltage $U_R = U_{DS,max}$ and/or as soon as the maximum permissible component temperature $T_{M,max}$ is exceeded. For an arrangement as shown in FIG. 1, a comparator threshold $U_R$ is adjusted to $U_{DS,max}$.

On the one hand, the dimensioning of the switch/control circuit has the advantage that the maximum temperature for the switch operation no longer is a purely estimated value, but can be measured. It is not important in this case whether the temperature is measured in direct contact with an active zone J, particularly a barrier layer, in the switching member. Rather, it is now advantageously possible to determine the temperature on the outside of the switch, preferably at the housing 2 or the cooling vane 3 of switch M1. This can be done without risking the danger of an overheating of the active zone J due to short-term peaks in the loss power or local temperature differences. It is particularly useful if a temperature sensor is arranged on a contact connection with good electrical and thermal coupling to the active zone J of the switch. To be sure, the uncertainties with respect to the heat discharge must still be taken into account for dimensioning the continuous operation, but they do not affect the operation of the automatic switch protection.

The advantages of the invention become particularly apparent with technical designs having only low heat dissipation to the environment, such as is frequently the case when installing power semiconductors in control units.

The equivalent thermal resistance $R_{th,JM}$ does not depend as strongly on the environmental conditions of the switch assembly as does the thermal resistance between active zone J and environment $R_{th,JA}$. In addition, the manufacturing tolerances for a switch are relatively insignificant and $R_{th,JM}$ can therefore be estimated with sufficient accuracy for a plurality of switches.

The dimensioning advantageously allows high currents to flow through the switch, at least for a short period of time, thereby permitting a considerably better utilization of the switch.

The danger of an overheating of the switch does not exist since the loss power remains limited, in contrast to the purely thermal shutdown according to the prior art. In accordance with the invention, the static thermal resistances are used as criterion for dimensioning the control circuit. The switch therefore can tolerate high starting current peaks. The loss power at the active zone J can be absorbed by the heat capacities that surround the active zone J, until $T_{M,max}$ is reached at the measuring point. It is advantageous if the overcurrent circuit breaker for the switch is briefly stopped, preferably during the start-up operation. The increased load current can heat up the switch only until the maximum permissible temperature $T_{M,max}$ is reached and/or as long as the maximum permissible loss power $P_{v,max}$ is not exceeded.

Figure 5:
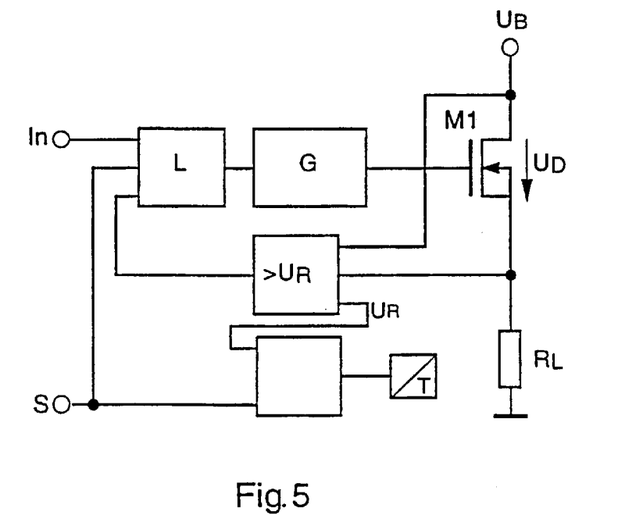
FIG. 5 A preferred switching arrangement.

FIG. 5 shows another advantageous embodiment of the arrangement. In this case, the temperature signal T is used for a variation of the threshold value $U_R$ of the residual voltage monitoring in the control circuit. The variation of the interrupting current $I_D$ that is caused by the temperature dependence of the on-resistance $R_{DS,on}$, of switch M1 can be compensated in this way.

In principle, all sensors normally used for this purpose can be used as temperature sensors. The use of transistors or diodes is particularly useful. A switching arrangement of this type is shown in FIG. 5. The invention provides that when installing a temperature sensor, especially a low-level signal bipolar transistor, at a temperature measuring point at one of the electrical connections, which has a good heat transfer to the semiconductor member of the temperature sensor from an assembly-technological point of view, at the same time results in the thermal coupling of the temperature sensor at the measuring point. Special preference is given to the arrangement where a sensor contact of this type is linked to an electrical contact of switch M1, which also has a good heat transition to the body, especially the semiconductor body of the switch.

Figure 6:
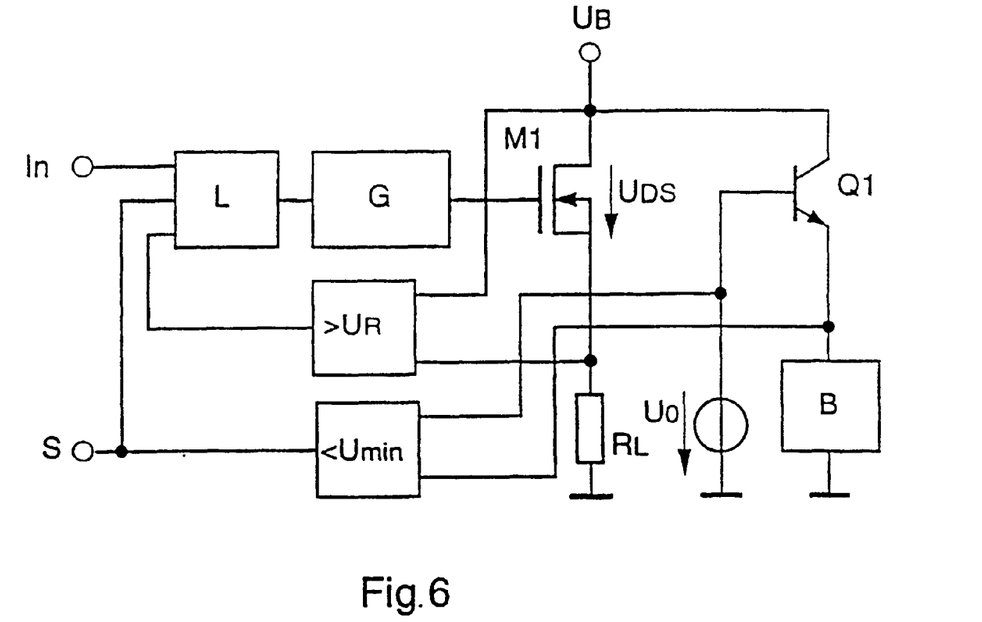
FIG. 6 A preferred switching arrangement.

A power MOSFET that is used as switch M1, as well as a standard low-signal bipolar transistor Q1 as temperature sensor are shown in FIG. 6. Both transistors M1, Q1 have an electrical connection with good thermal coupling to the respective semiconductor body. For this, the drain connection is preferably selected for the power MOSFET M1, while the collector terminal is preferably selected for the bipolar transistor Q1. It is preferable if the drain connection of the MOSFET M1 is connected to the collector of the bipolar transistor Q1.

A reference potential $U_0$ is preferably maintained at the base of transistor Q1. A predetermined collector current is adjusted via a bias arrangement B, known per se, preferably a resistance or a current source. The base-emitter voltage $U_{BE}$ of transistor Q1 serves as measure for the temperature $T_M$. It is an advantage that the base-emitter voltage $U_{BE}$ can be used not only for monitoring the maximum permissible switch temperature, but can also be used sensibly for influencing the interrupting threshold $U_R$ of the control circuit for the residual voltage monitoring. An otherwise occurring temperature dependence of the maximum permissible load current $I_{D,max}$ is avoided in this way, so that the same maximum load current $I_{D,max}$ is permissible in the switch M1 for each permissible switching temperature $T_{M,max}$.

Figure 7:
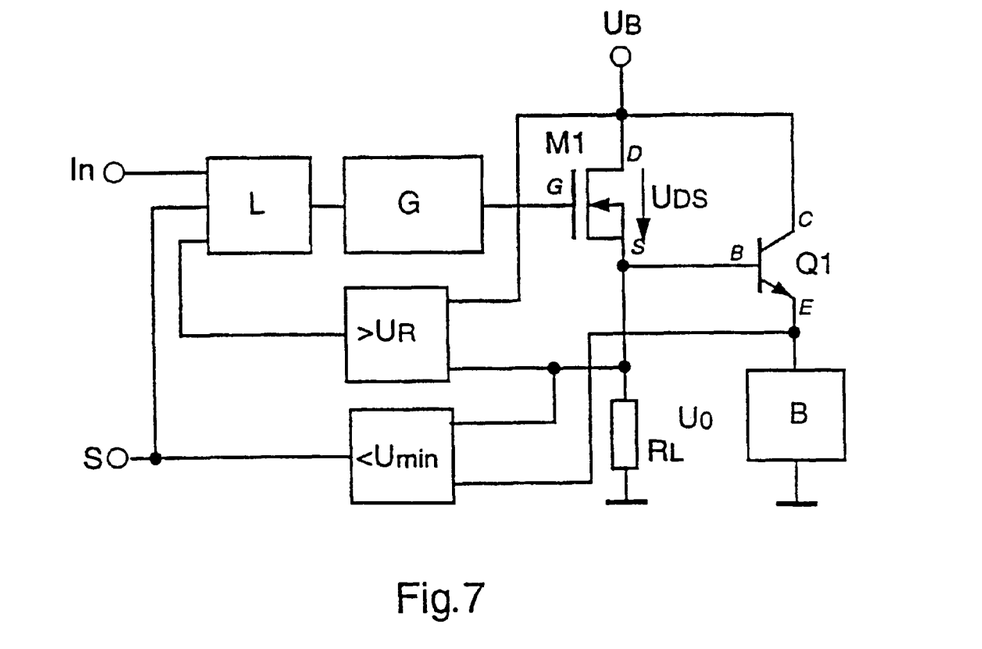
FIG. 7 A preferred switching arrangement.

FIG. 7 shows another switching arrangement according to the invention, with good heat coupling between temperature sensor Q1 and switch M1. Not only is the collector of transistor Q1 connected to the drain connection of the semiconductor MOSFET M1 there, but the base of Q1 is also connected to the source connection of switch M1. This type of arrangement for the temperature sensor transistor Q1 at the switch M1 is particularly advantageous if the transistor Q1 is available not as a discrete component, but as a parasitic structure on or in the semiconductor body of switch M1.

Figure 8:
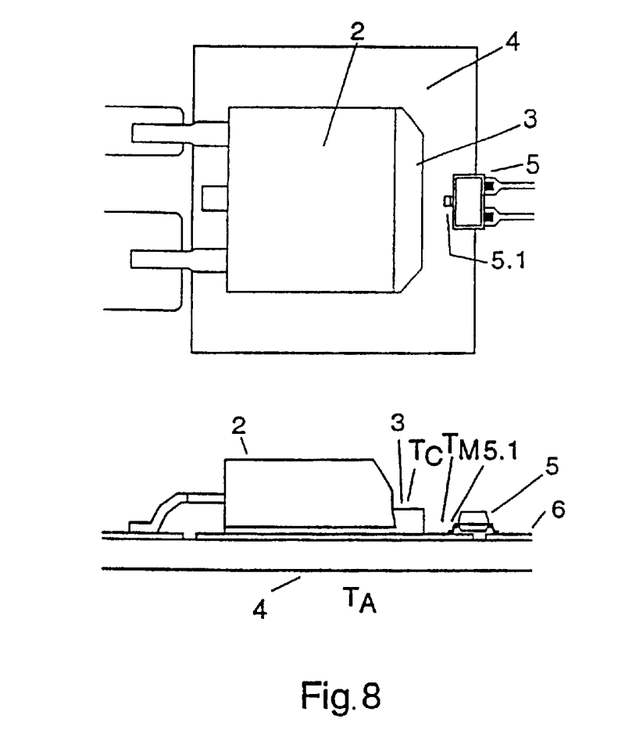
FIG. 8 A view from above and the cross section through an arrangement according to the invention.

FIG. 8 shows a view from above and a section through the side of an arrangement according to the invention of components for a protective arrangement, which is particularly suited for use in electronic control units. The switch M1 and the temperature sensor 5, especially a bipolar transistor Q1, are designed as components to be mounted on the surface. Together with the cooling vane 3, which represents in particular the drain connection for switch M1, the switch M1 inside the housing 2 is arranged at least indirectly on a heat sink 4 that is preferably a printed circuit board. Electrical contact surfaces 6, e.g. one or several copper conductive tracks, are arranged between heat sink 4 and cooling vane 3. The contact surface 6, which is connected to the drain connection 3 of the MOSFET switch, serves as heat distributor. The collector terminal 5.1 of the bipolar transistor Q1 is positioned on the contact surface 6, near the cooling vane 3 of switch M1, and is preferably soldered on.

It is particularly advantageous if he threshold voltage $U_R$ of the control circuit is changed, preferably by using the temperature sensor Q1, by taking into account the temperature dependence of the residual resistance $R_{DS,on}$ of switch M1, in such a way that the switch is turned off at different operating temperatures with a predetermined, constant load current $I_{D,max}$.

The advantages of the preferred arrangement are shown in one dimensioning example. The invention is not limited to the values specified in the example.

Given a maximum on-resistance of switch M1, particularly a power transistor, of $R_{DS,on,max}$=25 mΩ and a maximum permissible temperature of the active zone J, especially a barrier layer, of $T_{J,max}$=175° c, with $R_{th,JC}$=1.5 K/W and $R_{th,CA}$=25 K/W and the maximum expected environmental temperature of 80° C., a maximum permissible load current of $I_{D,max}$=12A results for a protective arrangement without temperature monitoring. Once this value is reached the switch is turned off, at least indirectly. Particular attention must be paid to the fact that the maximum permissible load current $I_{D,max}$ should not be exceeded.

If the preferred arrangement with temperature control and residual voltage control is monitored under the same marginal conditions, this value $I_{D,max}$ is also the maximum permissible permanent load current for switch M1. With a predetermined upper switch temperature of $T_{M,max}$=125° C. and an equivalent thermal resistance $R_{th,JM}$=2 K/W, however, a much higher value results for a permissible peak current of $I_{D,max}$=32 A. This load current can flow for a short period, in particular up to several seconds, in the switch M1, without causing damage to the switch. In the process, the switch M1 heats up and the excess temperature monitoring switches off once the maximum permissible switch temperature is reached. In addition to the basic improvement in the safety, particularly in the static case, this represents a better use of the switch M1 by a factor of 2.5 for the example described.

Another and especially useful method for the overload protection of switches can preferably be used with MOSFET switches. The precise measuring of the load current $I_{D,max}$ requires including the temperature dependence of the on-resistance $R_{DS,on}(T_J)$ for the switch, wherein the following applies $I_{D,max}=U_{DS,max}/R_{DS,on}(T_J)$. This value can change by a factor of 2–3 over the complete temperature range for which the system is used. To be sure, the interruption at an impermissible loss power is ensured during the heating up of the semiconductor, but it cannot be used as electronic safety because of the high variation in the load current $I_{D,max}$.

It is preferable if the switching threshold $U_R$ is changed with a signal, obtained from the on-state voltage $U_{BE}$ of a temperature sensor Q1, preferably a bipolar transistor or a diode, which is thermally coupled tightly with the semiconductor switch M1. In the process, the threshold value $U_R$ is influenced by superimposing the temperature measuring signal, so that the switch is shut down at a constant value for the load current $I_{D,max}$ by changing the threshold voltage $U_R$, independent of the operating temperature. If the threshold value $U_R$ remains unchanged, but the on-resistance $R_{DS,on}(T_J)$ increases with the increase in the temperature, the switch is shut down too early at an excessively low load current $I_D$.

Figure 9:
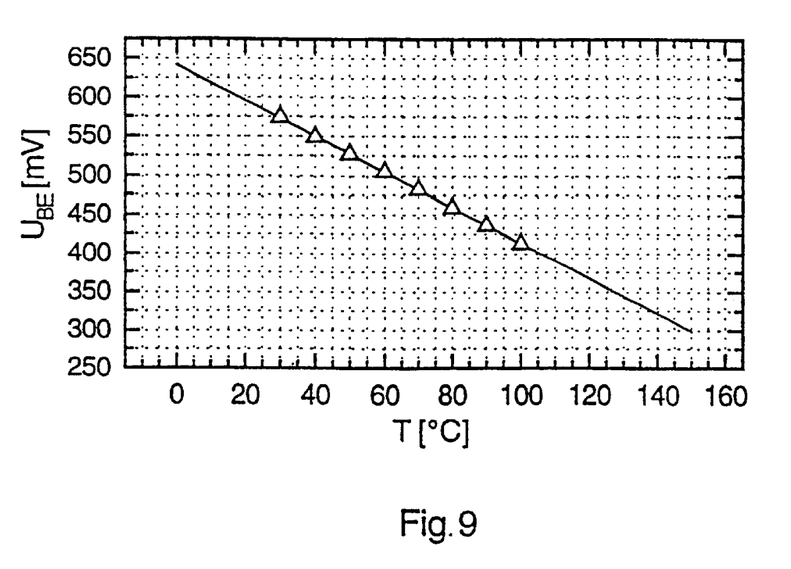
FIG. 9 Dependence of the base-emitter voltage of a transistor on the temperature.

The base-emitter voltage $U_{BE}$ of a bipolar transistor has a linear dependence on the temperature in a first, sufficiently good approximation, wherein $U_{BE}(T)=U_{BE}(T_0)-\lambda \cdot (T-T_0)$. $T_0$ is a reference temperature. FIG. 9 demonstrates the quality of this approximation through a comparison between typical measuring values for the base-emitter voltage $U_{BE}(T)$ of a bipolar transistor as function of the temperature and a compensating line. $U_{BE}(T)$ drops if the temperature increases.

Figure 10:
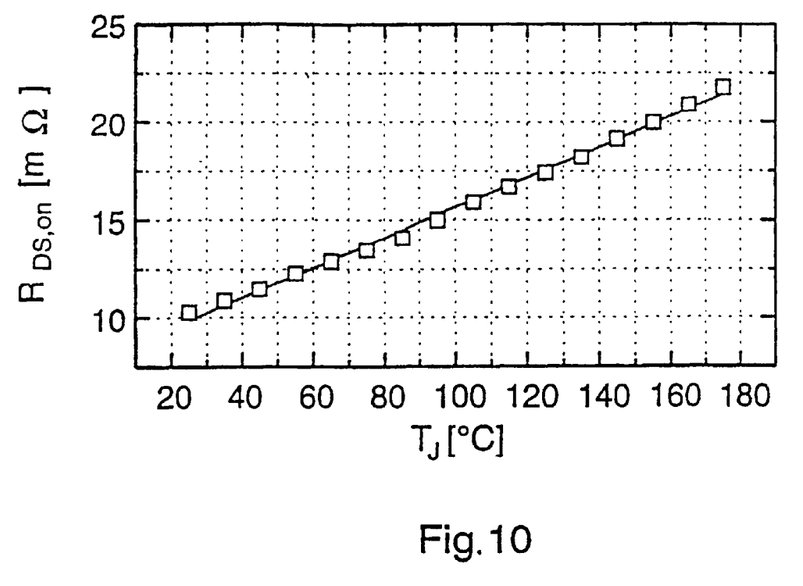
FIG. 10 Dependence of the on-resistance of a transistor on the temperature.

The temperature course of the on-resistance for a MOSFET can also be described with sufficient accuracy by using a linear approximation, wherein the following applies: $R_{DS,on}(T)=R_{DS,on}(T_0)\cdot(1+\alpha\cdot(T-T_0))$. The linear temperature dependence is shown in FIG. 10 with the aid of a comparison between measuring points and compensating line. The on-resistance $R_{DS,on}(T)$ increases with increasing temperature. Similar assumptions can also be made with sufficient accuracy for other components.

Since the on-resistance $R_{DS,on}(T)$ and thus also the voltage drop $U_{DS}$ on the load circuit side of switch M1 rises with the temperature if the load current $I_D$ remains constant, a voltage that is proportional to a temperature measuring voltage is added according to the invention at the correct ratio to the drain-source voltage, in order to obtain a constant interruption threshold $U_R$.

Figure 11:
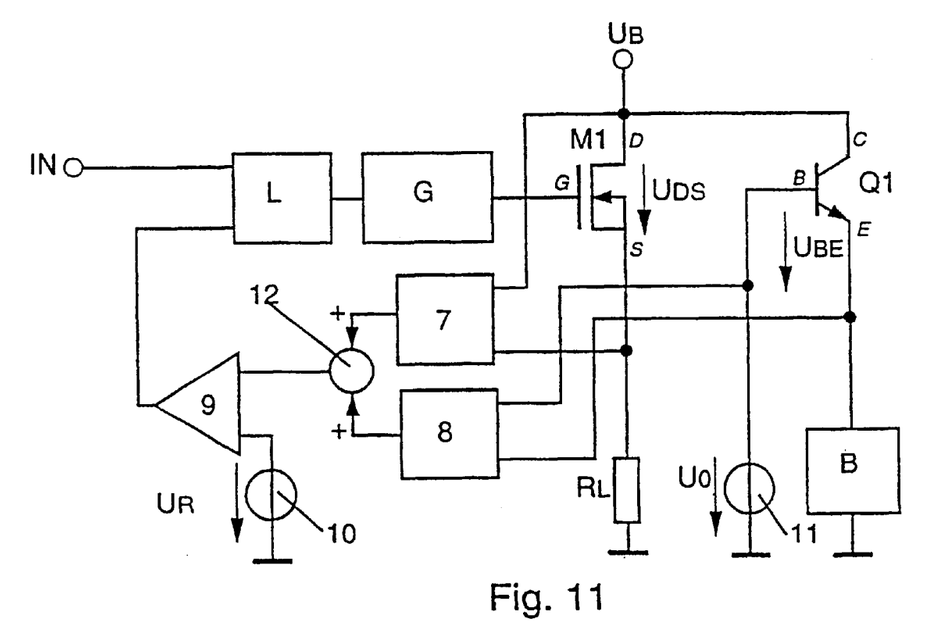
FIG. 11 A preferred switching arrangement for compensating the switching threshold of the control circuit for a switch.

FIG. 11 shows the basic switching arrangement according to the invention, which is designed to realize the preferred method. The logic L, known per se, and a gate driver G that can also comprise a charge pump actuate the switch M1. According to the invention, the bipolar transistor Q1 functions as temperature sensor. In that case, the temperature sensor can be arranged near or far from the barrier layer and at least indirectly at the switch, the housing, a possibly existing heat sink, or any other suitable measuring point of the switching arrangement. The operating point of transistor Q1 is adjusted via a bias circuit B that is known per se, preferably a constant current source, and the bias voltage source 11 is adjusted with $U_0$. It is also possible to use a variable voltage in place of the voltage source 11.

In one variation, the base B of transistor Q1 is connected to the source electrode S of M1 instead of the bias voltage $U_0$. This variant is not shown in the Figure. The residual voltage at switch M1 is tapped via a voltage meter 7, known per se, the base-emitter voltage $U_{BE}$ is tapped via a voltage meter 8, known per se, and is respectively weighted with a constant factor $k_7$, $k_8$. In the simplest case, 7 and 8 represent direct connections or level shifters. The output signals of 7 and 8 are added in a summer 12. The summer 12 is formed in the simplest case by a resistor where two currents are superimposed. A comparator 9, known per se, compares the output signal to a reference voltage 10 with the value $U_R$. If $U_R$ is exceeded, the power switch M1 is switched off via the logic L.

In one exemplary embodiment according to the invention, the output signal of 7 and 8 is a voltage. The output voltage of 8 is the base-emitter voltage of Q1, weighted with a factor $k_8$.

$$U_8=k_8[U_{BE}(T_0)-\lambda\cdot(T-T_0)].$$

The residual voltage $U_{DS}$ of M1 is weighted with a factor $k_7$ and the following applies:

$$U_7=k_7[I_D R_{DS,on}(T_0)(\lambda+\alpha(T-T_0))].$$

With the maximum residual voltage $U_{DS,max}=I_D\cdot R_{DS,on}(T_0)$ that is desirable for the reference temperature, the following voltage value $U_{12}$ is obtained at the output of 12:

$$U_{12}=k_7\cdot U_{DS,max}+k_8\cdot U_{BE}(T_0)+k_7\cdot U_{DS,max}\cdot \alpha\cdot(T-T_0)-k_8\cdot\lambda\cdot(T-T_0).$$

This expression becomes temperature-independent if the following applies:

$$(k_7/k_8)=\lambda/(U_{DS,max}\cdot\alpha).$$

In simplest case, $k_7$ or $k_8$ can be selected freely, e.g. $k_7=1$. It is preferable if one parameter, particular preference is given to $k_7$, is selected such that the wiring for the protective arrangement can be dimensioned with values that make sense for the layout. The other parameter will follow accordingly. The reference source 10 is adjusted to:

$$U_R=k_8\cdot(\lambda/\alpha+U_{BE}(T_0)).$$

Figure 12:
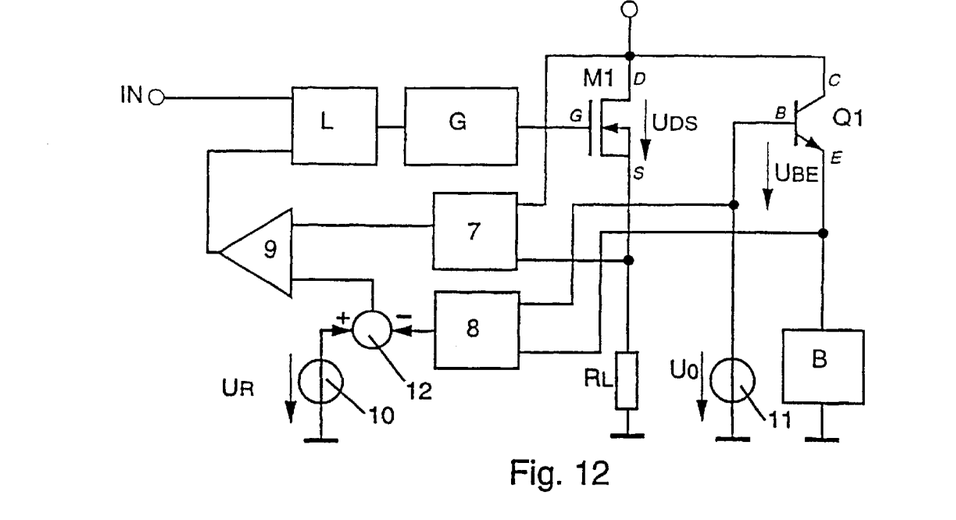
FIG. 12 A preferred switching arrangement for compensating the switching threshold of the control circuit for a switch.

The same result can be achieved if the temperature signal is added to the reference voltage $U_R$ for the interrupting threshold. FIG. 12 shows this exemplary embodiment according to the invention. The output of 8 is subtracted from the voltage at the voltage source 10. The result is the same as described in the above.

Figure 13:
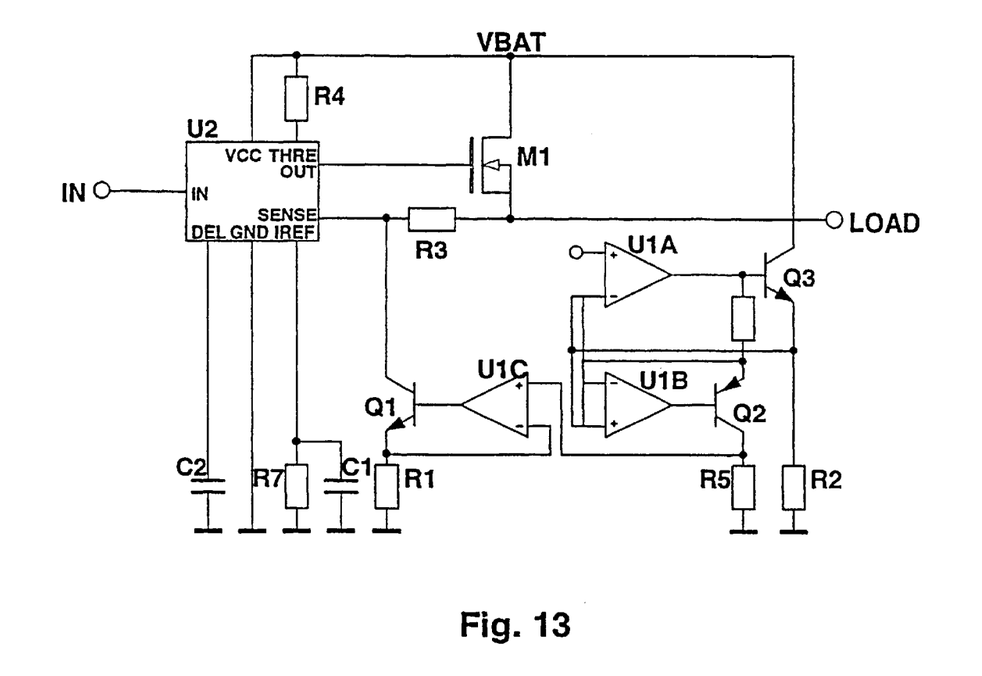
FIG. 13 The wiring for a preferred switching arrangement for compensating the switching threshold of the control circuit for a switch.

FIG. 13 shows an example for wiring a switching arrangement according to the invention. Logic and gate driver U2 are realized with a standard module (e.g. LM9061 of the company National Semiconductor), which already contains a standard residual voltage monitoring. The voltage at the input THRE is adjusted with R4. If the voltage at SENSE exceeds this value, the power switch M1 is shut down. According to the invention, the transistor Q3, which is operated with R2 and U1A as power source, is used for the temperature measuring. U1B, Q2 and R5 assume the role of unit 8 in FIG. 11. Unit 7 is not specifically embodied, but is shown only simplified as a connection. U1C, Q1 and R1 convert the voltage at R5 to a current, which causes a proportional current drop at the resistor R3. The sum of the residual voltage and the temperature signal is present at SENSE. The summer 12 is realized in this way. The constants $\lambda$ and $\alpha$ follow from the dimensioning of the resistors for the wiring example.

What is claimed is:

1. An arrangement for overload protection of a switch, to which a load circuit and a control circuit are connected, wherein:

the control circuit includes at least one logic circuit, a gate drive connected between an output of the logic circuit and a control input of the switch, a comparator, which compares a voltage drop across the switch to a predetermined threshold value, and a temperature sensor a discrete component relative to at least the switch and having an associated threshold-value recognition;

the logic circuit is responsive to the output of the comparator and the temperature sensor to cause the gate driver to switch off the switch when at least one limit value for the voltage drop across the switch, or a limit value for the permissible switch temperature, is exceeded; and the temperature sensor has its temperature-measurement point on an external electrical connection of the switch, with this electrical connection simultaneously serving for the thermal coupling of the temperature sensor and the switch.

2. The arrangement according to claim 1, wherein the external electrical connection is a cooling vane for the switch, which is electrically connected to the switch.

3. The arrangement according to claim 2, wherein the switch is a MOSFET.

4. The arrangement according to claim 3, wherein the drain contact of the MOSFET is connected to the cooling vane so as to conduct electricity.

5. The arrangement according to claim 3, wherein the temperature sensor is a bipolar transistor.

6. The arrangement according to claim 5, wherein the drain contact of the MOSFET is connected to the collector terminal of the bipolar transistor.

7. The arrangement according to claim 5, wherein the MOSFET and the temperature sensor are mounted on the same cooling body.

8. The arrangement according to claim 5, wherein the collector of the transistor is thermally and electrically connected to the drain of the MOSFET, and the base of the transistor is thermally and electrically connected to the source of the MOSFET.

9. The arrangement according to claim 1, wherein the temperature sensor is formed by a diode.

10. The arrangement according to claim 5, wherein the base emitter voltage ($U_{BE}$) of the bipolar transistor serves as a linearized measured temperature signal.

11. The arrangement according to claim 5, wherein a first voltage-measuring device measures the voltage across the switch, and a second voltage-measuring device measures the voltage at the temperature sensor, and the two voltage values from the first and second voltage-measuring devices are then added with an adder, and the summation voltage is supplied to the comparator for comparison with a threshold value (VR).

12. The arrangement according to claim 11, wherein the threshold value (UR) of the comparator satisfies the equation $UR=k8(\lambda/\alpha)+U_{BH}(T_0))$, where a represents the slope of the at least partially linearized characteristic curve of the turn-on resistance of the switch as a function of the temperature, $\lambda$ represents the slope of the at least partially linearized characteristic curve of the forward voltage $U_{BE}$ of the transistor as a function of the temperature, and k8 is a constant.

13. The arrangement according to claim 9, wherein a first voltage-measuring device measures the voltage across the switch, and a second voltage-measuring device measures the voltage at the temperature sensor, and the two voltage values from the first and second voltage-measuring devices are then added with an adder, and the summation voltage is supplied to the comparator for comparison with a threshold value (VR).

14. The arrangement according to claim 13, wherein the threshold value (UR) of the comparator satisfies the equation $UR=k8(\lambda/\alpha)+U_{BH}(T_0))$, where a represents the slope of the at least partially linearized characteristic curve of the turn-on resistance of the switch as a function of the temperature, A represents the slope of the at least partially linearized characteristic curve of the forward voltage $U_{BE}$ of the diode as a function of the temperature, and k8 is a constant.

15. The arrangement according to claim 1, wherein the logic circuit and the gate driver form a unit in a common module having an integrated residual-voltage monitoring mechanism.

* * * * *